United States Patent
Mochiki

(10) Patent No.: US 7,723,236 B2
(45) Date of Patent: May 25, 2010

(54) GAS SETTING METHOD, GAS SETTING APPARATUS, ETCHING APPARATUS AND SUBSTRATE PROCESSING SYSTEM

(75) Inventor: Hiromasa Mochiki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 649 days.

(21) Appl. No.: 11/333,289

(22) Filed: Jan. 18, 2006

(65) Prior Publication Data

US 2006/0157445 A1 Jul. 20, 2006

Related U.S. Application Data

(60) Provisional application No. 60/648,706, filed on Feb. 2, 2005.

(30) Foreign Application Priority Data

Jan. 18, 2005 (JP) ............................. 2005-010438

(51) Int. Cl.
*H01L 21/302* (2006.01)
(52) U.S. Cl. ...................... 438/706; 438/714; 438/734; 438/735; 216/58; 216/60; 216/61; 216/63
(58) Field of Classification Search .................. 216/59, 216/63, 58, 60, 61; 438/714, 734, 935, 706, 438/735
See application file for complete search history.

(56) References Cited

U.S. PATENT DOCUMENTS 5,356,515 A * 10/1994 Tahara et al. ................. 438/715
5,744,049 A * 4/1998 Hills et al. ..................... 216/67
6,042,687 A * 3/2000 Singh et al. ............. 156/345.33
6,238,588 B1 * 5/2001 Collins et al. .................. 216/68
6,245,192 B1 * 6/2001 Dhindsa et al. ......... 156/345.34
6,333,272 B1 * 12/2001 McMillin et al. ............. 438/710
6,465,359 B2 * 10/2002 Yamada et al. ............... 438/706
2003/0070620 A1 * 4/2003 Cooperberg et al. .. 118/723 AN
2004/0031564 A1 * 2/2004 Gottscho et al. ........ 156/345.24
2004/0112539 A1 * 6/2004 Larson et al. ........... 156/345.33
2006/0042754 A1 * 3/2006 Yoshida et al. ............ 156/345.1

FOREIGN PATENT DOCUMENTS

| JP | 61-100935 | * | 5/1986 |
| JP | 61-163640 | * | 7/1986 |
| JP | 08-158072 | * | 6/1996 |
| JP | 2002-217171 | * | 8/2002 |

* cited by examiner

*Primary Examiner*—Binh X Tran
(74) *Attorney, Agent, or Firm*—Oblon, Spivak, McClelland, Maier & Neustadt, L.L.P.

(57) ABSTRACT

Mixing ratio and flow rate of a first gaseous mixture supplied to a central portion of the substrate are set. Subsequently, etching is performed by changing a mixing ratio of a second gaseous mixture supplied to an outer peripheral portion of the substrate while a setting of the first gaseous mixture is fixed, thereby, setting the mixing ratio of the second gaseous mixture based on an etching result to make etching selectivities and shapes at the central portion and the outer peripheral portion of the substrate uniform. Then, etching is performed by changing a flow rate of the second gaseous mixture while settings of the first gaseous mixture and the mixing ratio of the second gaseous mixture are fixed, thereby, setting the flow rate of the second gaseous mixture based on etching results to make etching rates at the central portion and the outer peripheral portion of the substrate uniform.

5 Claims, 10 Drawing Sheets

FIG.12

CORRELATION DATA D

| SETTING OF THE FIRST GASEOUS MIXTURE | | SETTING OF THE SECOND GASEOUS MIXTURE | | ETCHING CHARACTERISTIC | | |
|---|---|---|---|---|---|---|
| MIXING RATIO | FLOW RATE | MIXING RATIO | FLOW RATE | SELECTIVITY | SHAPE | RATE |
| a1 | b1 | c1 | d1 | x1 | y1 | z1 |
| ↑ | ↑ | ↑ | d2 | x2 | y2 | z2 |
| ↑ | ↑ | ↑ | d3 | x3 | y3 | z3 |
| ↑ | ↑ | ↑ | d4 | x4 | y4 | z4 |
| ↑ | ↑ | ↑ | d5 | x5 | y5 | z5 |
| ↑ | ↑ | c2 | d1 | x6 | y6 | z6 |
| ↑ | ↑ | ↑ | d2 | . | . | . |
| ↑ | ↑ | ↑ | d3 | . | . | . |
| ↑ | ↑ | ↑ | d4 | . | . | . |
| ↑ | ↑ | ↑ | d5 | . | . | . |
| ⋮ | ⋮ | ⋮ | ⋮ | ⋮ | ⋮ | ⋮ |
| ↑ | b2 | c1 | d1 | . | . | . |
| ↑ | ↑ | ↑ | d2 | . | . | . |
| ↑ | ↑ | ↑ | d3 | . | . | . |
| ↑ | ↑ | ↑ | d4 | . | . | . |
| ↑ | ↑ | ↑ | d5 | . | . | . |
| ⋮ | ⋮ | ⋮ | ⋮ | ⋮ | ⋮ | ⋮ |
| a2 | b1 | c1 | d1 | . | . | . |
| ↑ | ↑ | ↑ | d2 | . | . | . |
| ↑ | ↑ | ↑ | d3 | . | . | . |
| ↑ | ↑ | ↑ | d4 | . | . | . |
| ↑ | ↑ | ↑ | d5 | . | . | . |
| ⋮ | ⋮ | ⋮ | ⋮ | ⋮ | ⋮ | ⋮ |

GAS SETTING METHOD, GAS SETTING APPARATUS, ETCHING APPARATUS AND SUBSTRATE PROCESSING SYSTEM

FIELD OF THE INVENTION

The present invention relates to a gas setting method of an etching gas supplied to a processing chamber, a gas setting apparatus, an etching apparatus and a substrate processing system.

BACKGROUND OF THE INVENTION

In a manufacturing process of an electronic device such as a semiconductor device, a liquid crystal display device or the like, an etching process for etching a film on a substrate in a predetermined shape is carried out to form a predetermined circuit pattern on the substrate.

In the aforementioned etching process, a plasma etching process is widely used. A plasma etching apparatus has, e.g., in a processing chamber thereof, a lower electrode for mounting a substrate thereon, and a shower head, also serving as an upper electrode, for injecting a predetermined gas toward the substrate on the lower electrode. The etching process is performed to etch a film on the substrate in such a manner that a high frequency power is applied between the upper and the lower electrode to produce a plasma in the processing chamber, e.g., while a predetermined gaseous mixture is being injected into the processing chamber through the shower head.

However, in case where the gaseous mixture is supplied into the processing chamber through the shower head to perform the etching process on the substrate, as mentioned above, there was a problem that etching characteristics such as etching rate, etching selectivity, etching shape and the like at the central portion of the substrate are different from those at the outer peripheral portion of the substrate, respectively. This has been attributed to the fact that, in the processing chamber, a concentration and a component of the gaseous mixture at the central portion of the substrate are different from those at the outer peripheral portion of the substrate, respectively. Therefore, e.g., in Japanese Patent Laid-open Application No. H08-158072, there has been proposed that an inside of an upper electrode as a shower head is divided into a plurality of gas chambers; gas introducing lines are independently connected to the respective gas chambers; and the gaseous mixtures of specified mixing ratios and flow rates are supplied to the central portion and the outer peripheral portion of the substrate, respectively. In this way, it is possible to improve an in-substrate uniformity, e.g., in the etching rate, by respectively adjusting mixing ratios and flow rates of the gaseous mixtures supplied to the central portion and the outer peripheral portion of the substrate in the processing chamber.

Meanwhile, in the case mentioned above, to set the respective mixing ratios and flow rates of the gaseous mixtures supplied to the central portion and the outer peripheral portion of the substrate, all etching characteristics such as etching rate, etching selectivity and etching shape need to be considered, and then, setting of each gaseous mixture is carried out such that each etching characteristic of in-substrate becomes uniform. Since, however, a relationship between each etching characteristic and the mixing ratio or the flow rate of each gaseous mixture supplied to the central portion or the outer peripheral portion of the substrate was not clearly defined, it was difficult to properly perform the setting of each gaseous mixture. Further, it takes much time to find the proper setting of each gaseous mixture and fix it.

SUMMARY OF THE INVENTION

The present invention is contrived on the basis of the aforementioned problems, and it is, therefore, an object of the present invention to provide a gas setting method, a gas setting apparatus, an etching apparatus and a substrate processing system, capable of readily and simply performing a setting of each gaseous mixture, which is supplied to a central portion or an outer peripheral portion of a substrate in a processing chamber, in a short time.

In accordance with one aspect of the present invention, for achieving the aforementioned object, there is provided a gas setting method for setting a mixing ratio and a flow rate of a gaseous mixture supplied into a processing chamber, in which an etching is carried out on a substrate, the method including the steps of: setting a mixing ratio and a flow rate of a first gaseous mixture supplied to a central portion of the substrate; subsequently performing an etching by changing a mixing ratio of a second gaseous mixture supplied to an outer peripheral portion of the substrate while a setting of the first gaseous mixture being fixed, and thereafter, setting the mixing ratio of the second gaseous mixture based on an etching result such that at least one of etching selectivities and etching shapes at the central portion and the outer peripheral portion of the substrate becomes uniform; and then performing an etching by changing a flow rate of the second gaseous mixture while settings of the first and the second gaseous mixture being fixed, and thereafter, setting the flow rate of the second gaseous mixture based on etching results thereof such that etching rates in the central portion and the outer peripheral portion of the substrate become uniform.

The present inventor has confirmed that, if the mixing ratio and the flow rate of the second gaseous mixture supplied to the outer peripheral portion of the substrate are changed while those of the first gaseous mixture supplied to the central portion thereof are fixed, etching characteristics at the outer peripheral portion of the substrate can be efficiently adjusted. It is assumed that the first gaseous mixture supplied to the central portion of the substrate runs towards the outer peripheral portion from the central portion of the substrate, to thereby, equally affect the etching characteristics in both of the central portion and the outer peripheral portion of the substrate, but on the other hand, the second gaseous mixture supplied to the outer peripheral portion of the substrate runs from the outer peripheral portion of the substrate to the outside, to thereby, greatly affect the etching characteristic in the outer peripheral portion of the substrate. Further, the present inventor has confirmed that the mixing ratio of the second gaseous mixture affects the etching selectivity, the etching shape and the etching rate at the outer peripheral portion of the substrate. Still further, it has been secured that the flow rate of the second gaseous mixture only affects the etching rate at the outer peripheral portion of the substrate. Accordingly, in accordance with the present invention, the etching process is performed several times by changing a mixing ratio of the second gaseous, and then, the mixing ratio of the second gaseous mixture may be set based on the etching result such that etching selectivities and etching shapes at the central portion and the outer peripheral portion of the substrate become uniform. Thereafter, the etching process is performed several times by changing a flow rate of the second gaseous mixture, and then, the flow rate of the second gaseous mixture may be set based on the etching result such that etching rates at the central portion and the outer peripheral portion of the substrate become uniform. In this way, it is possible to simply and properly perform the setting of the gaseous mixture in a short time such that etching characteristics of in-substrate may be made uniform.

In accordance with another aspect of the present invention, there is provided a gas setting apparatus for setting a mixing ratio and a flow rate of a gaseous mixture supplied to a processing chamber, in which an etching is performed on a substrate, wherein an etching is carried out by changing a mixing ratio of a second gaseous mixture supplied to an outer peripheral portion of a substrate while settings of a mixing ratio and a flow rate of a first gaseous mixture supplied to a central portion of the substrate being fixed; the mixing ratio of the second gaseous mixture is set to make at least one of etching selectivities and etching shapes at the central portion and the outer peripheral portion of the substrate uniform, on the basis of etching results thereof; an etching is performed by changing a flow rate of the second gaseous mixture while the settings of the first and the second gaseous mixture being fixed; and the flow rate of the second gaseous mixture is set based on etching result thereof such that flow rates at the central portion and the outer peripheral portion of the substrate become uniform.

In accordance with the present invention, it is possible to simply and properly perform the setting of the gaseous mixture in a short time such that etching characteristics of in-substrate may be made uniform, same as in the aforementioned one aspect of the invention.

In accordance with still another aspect of the present invention, there is provided a gas setting apparatus for setting a mixing ratio and a flow rate of a gaseous mixture supplied to a processing chamber, in which an etching is performed on a substrate, wherein a correlation between settings of a first and a second gaseous mixture and etching results thereof is drawn up based on the etching results obtained by way of performing an etching by changing at least one of a flow rate and a mixing ratio of the second gaseous mixture supplied to an outer peripheral portion of a substrate, while a mixing ratio and a flow rate of a first gaseous mixture supplied to a central portion of the substrate being fixed; and an etching is performed at an established gas setting; the mixing ratio of the second gaseous mixture wherein at least one of etching selectivities and etching shapes becomes uniform at the central portion and the outer peripheral portion of the substrate is calculated, based on the etching results and the correlation; and, subsequently, a flow rate of the second gaseous mixture wherein etching rates at the central portion and the outer peripheral portion of the substrate become uniform is calculated.

In accordance with the present invention, it is possible to simply and properly perform a change in the setting of each gaseous mixture, supplied to the central portion or the outer peripheral portion of the substrate, in a short time.

Herein, the gas setting apparatus may calculate the mixing ratio and the flow rate of the second gaseous mixture, if the etching result on an established gas setting falls outside a tolerance range.

Further, by the gas setting apparatus, the setting of the second gaseous mixture may be set as the calculated mixing ratio and flow rate.

BRIEF DESCRIPTION OF THE DRAWINGS

The above and other objects and features of the present invention will become apparent from the following description of preferred embodiments given in conjunction with the accompanying drawings, in which:

FIG. 12 presents an explanatory diagram showing a correlation data; and

DETAILED DESCRIPTION OF THE PREFERRED EMBODIMENTS

Figure 1:
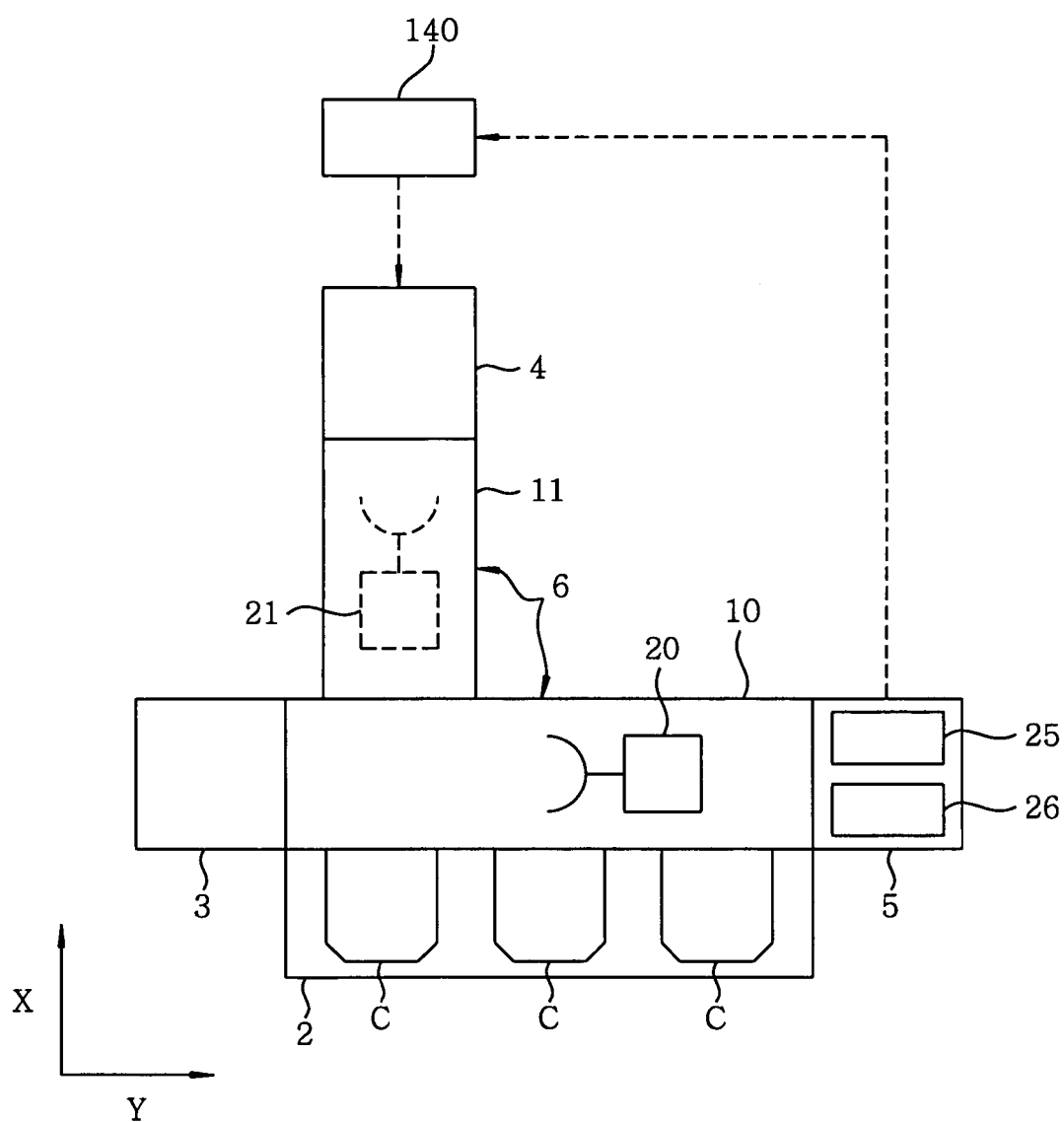
FIG. 1 provides a plane view showing a schematic configuration of a substrate processing system.

Hereinafter, preferred embodiments of the present invention will be described. FIG. 1 is a plane view showing a schematic configuration of a substrate processing system 1 having thereon an etching apparatus in accordance with the present embodiment.

The substrate processing system 1 includes a cassette mounting unit 2 for mounting thereon a plurality of cassettes C, each accommodating therein, e.g., a substrate W; an alignment unit 3 for positioning the substrate W; an etching apparatus 4 for performing an etching process on the substrate W; a measuring unit 5 for measuring an etching result of the substrate W; and a transfer unit 6 for transferring the substrate W between the cassette mounting unit 2, the alignment unit 3, the etching apparatus 4, and the measuring unit 5, wherein they are connected to each other as a unit.

The transfer unit 6 has a transfer chamber 10, to which, e.g., the cassette mounting unit 2, the measuring unit 5 and the alignment unit 3 are connected; and a load-lock chamber 11 for connecting the transfer chamber 10 to the etching apparatus 4. The cassette mounting unit 2 is provided, e.g., in the negative side along X direction in an X-Y frame whose origin is located in the transfer chamber 10 (in the downward direction in FIG. 1). The alignment unit 3 and the measuring unit 5 are provided, e.g., to have therebetween the transfer chamber 10 at both sides in the Y direction thereof (left and right direction in FIG. 1). The load-lock chamber 11 is provided, e.g., to face the cassette mounting unit 2 in the positive side along X direction of the transfer chamber 10 (an upper direction in FIG. 1).

In the transfer chamber 10, there is provided a transfer mechanism 20 for transferring, e.g., the substrate W supported by a transfer arm. For example, the transfer mechanism 20 can transfer the substrate W between the cassette mounting unit 2, the alignment unit 3, the measuring unit 5 and the load-lock chamber 11. In the load-lock chamber 11, there is provided a transfer mechanism 21 for transferring, e.g., the substrate W supported by a transfer arm. The transfer mechanism 21 can transfer the substrate W to, e.g., the etching apparatus 4 and the transfer chamber 10.

In the measuring unit 5, a film thickness measurement device 25 and a surface shape measurement instrument 26 are provided, e.g., as measuring devices, respectively. The film thickness measurement device 25 can measure an etching rate and an etching selectivity during the etching process by measuring film thicknesses of an etching mask, a film to be etched and a base film, e.g., on a residual substrate W after the etching process has been completed. Further, the surface shape measurement instrument 26 can measure a pattern shape (an etching shape) on a surface of the substrate W after the etching process has been completed, by way of irradiating a laser light onto the substrate W, e.g., through a scatterometry technology, and then, receiving a reflected light therefrom. As described above, in the measuring unit 5, etching results of the substrate W, i.e., the etching rate, the etching selectivity and the etching shape, can be measured by using the film thickness measurement device 25 and the surface shape measurement instrument 26.

Figure 2:
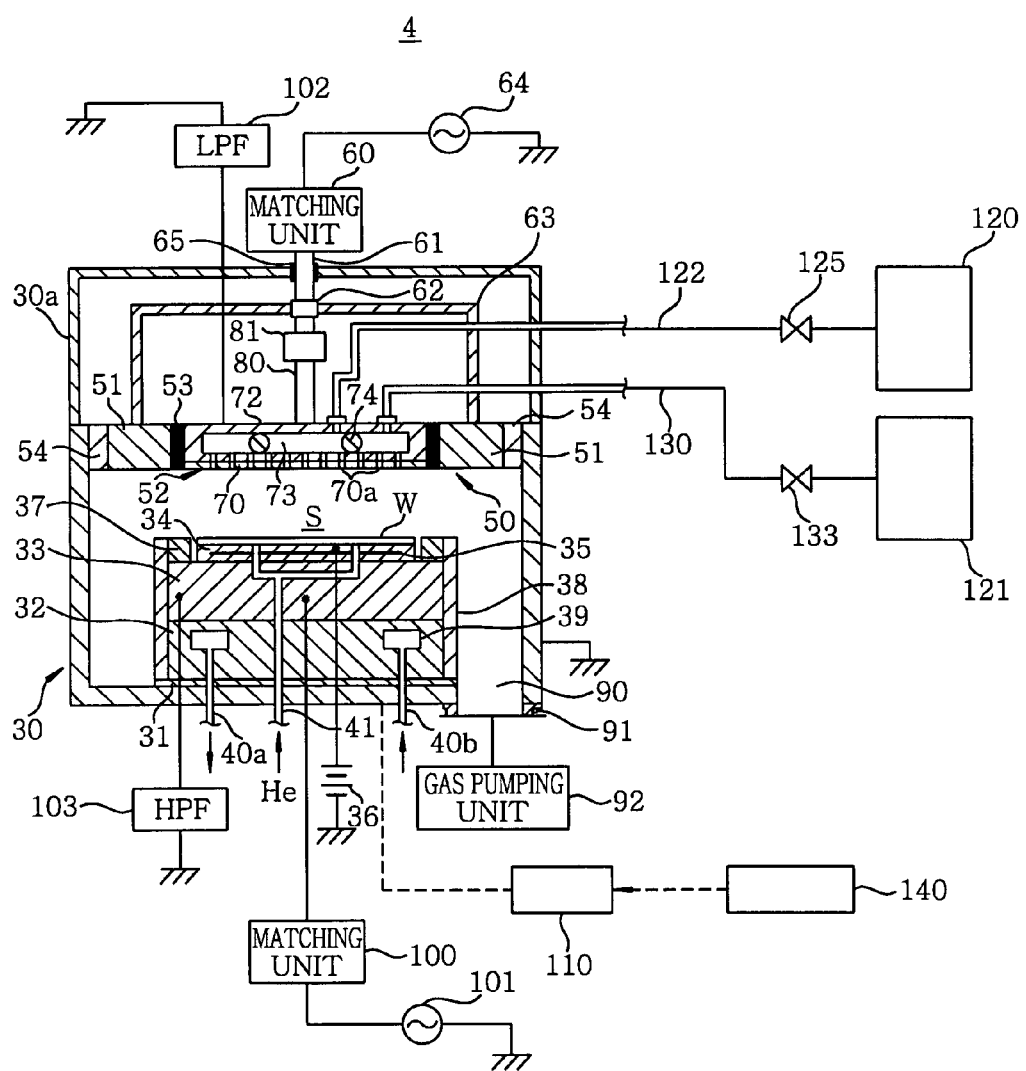
FIG. 2 offers a longitudinal cross sectional view explaining a schematic configuration of a plasma etching apparatus.

In the following, a configuration of the etching apparatus 4 will be explained. FIG. 2 is a longitudinal cross sectional explanatory diagram showing a schematic configuration of the etching apparatus 4.

The etching apparatus 4 is a capacitively coupled plasma etching apparatus having a parallel plate type electrode structure. The etching apparatus 4 has a substantially cylindrical processing vessel 30 forming therein a processing space S. The processing vessel 30 is made of, e.g., aluminum alloy, an inner wall surface of which is covered with an alumina film or an yttrium oxide film. The processing vessel 30 is grounded.

At a central bottom portion of the processing vessel 30, there is provided a columnar susceptor supporting table 32 on top of an insulating plate 31. A susceptor 33 as a mounting unit for mounting the substrate W thereon is supported on the susceptor supporting table 32. The susceptor 33 forms a lower electrode of the parallel plate type electrode structure. The susceptor 33 is formed of, e.g., aluminum alloy.

At an upper portion of the susceptor 33, an electrostatic chuck 34 for supporting the substrate W is provided. The electrostatic chuck 34 has therein an electrode 35 which is electrically connected to a DC power supply 36. A DC voltage from the DC power supply 36 is applied to the electrode 35 to generate Coulomb force, so that the substrate W is adsorbed on a top surface of the susceptor 33.

A focus ring 37 is provided on a top surface of the susceptor 33 around the electrostatic chuck 34. At outer peripheral surfaces of the susceptor 33 and the susceptor supporting table 32, a cylindrical inner wall member 38 made of, e.g., quartz, is attached.

A ring-shaped coolant chamber 39 is formed in the susceptor supporting table 32. The coolant chamber 39 communicates with a chiller unit (not shown) installed at the outer side of the processing vessel 30 through pipes 40a and 40b. A coolant or a cooling water is supplied into the coolant chamber 39 through the pipes 40a and 40b to be circulated therein so that the temperature of the substrate W on the susceptor 33 can be controlled. A gas supply line 41 passing through the susceptor 33 and the susceptor supporting table 32 is provided on the top surface of the electrostatic chuck 34 such that a heat transfer gas such as a He gas or the like can be supplied between the substrate W and the electrostatic chuck 34.

An upper electrode 50 facing the susceptor 33 in parallel therewith is provided above the susceptor 33. A plasma generation space is formed between the susceptor 33 and the upper electrode 50.

The upper electrode 50 has a ring-shaped outer side upper electrode 51, and a circular plate-shaped inner side upper electrode 52. A ring 53 of a dielectric material is intervened between the outer side upper electrode 51 and the inner side upper electrode 52. Between the outer side upper electrode 51 and an inner peripheral wall of the processing vessel 30, there is airtightly intervened a ring-shaped insulating shielding member 54 made of, e.g., alumina.

To the outer side upper electrode 51, there is electrically connected a first high frequency power supply 64 through a matching unit 60, an upper power feed rod 61, a connector 62 and a power feed barrel 63. The first power supply 64 can output a high frequency voltage having a frequency of 40 MHz or higher, e.g., 60 MHz.

The power feed barrel 63 is of a substantially cylindrical shape, e.g., having an opened bottom surface; and a lower end portion thereof is connected to the outer side upper electrode 51. A lower end portion of the upper power feed rod 61 is electrically connected to the central portion of the top of the power feed barrel 63. An upper end portion of the upper power feed rod 61 is connected to an output side of the matching unit 60. The matching unit 60 is connected to the first high frequency power supply 64 such that inner impedance and load impedance of the first high frequency power supply 64 are matched with each other. An outer side of the power feed barrel 63 is covered with a cylindrical ground conductor 30a having a sidewall of the same diameter as the processing vessel 30. A lower end portion of the ground conductor 30a is connected to an upper sidewall of the processing vessel 30. The aforementioned upper power feed rod 61 penetrates through the central portion of the top of the ground conductor 30a; and an insulating member 65 is intervened in a portion where the ground conductor 30a makes a contact with the upper power feed rod 61.

Figure 3:
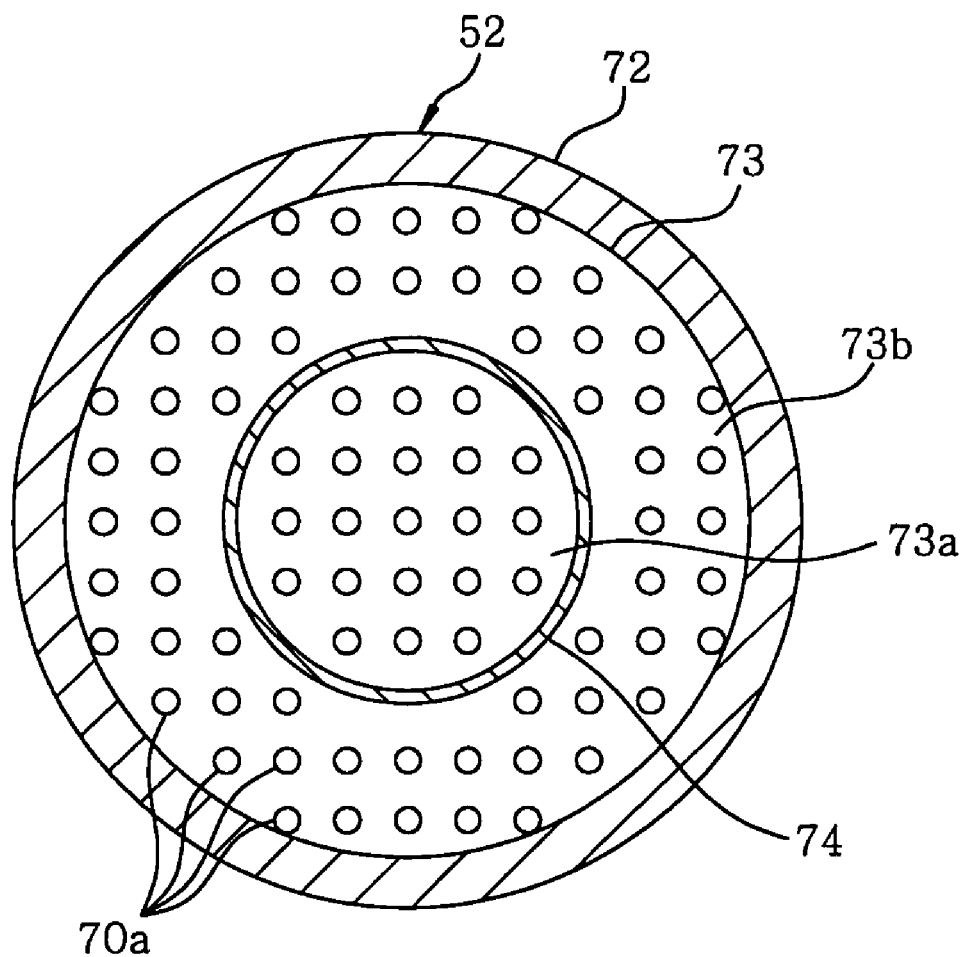
FIG. 3 sets forth a transversal cross sectional view of an inner side upper electrode.

The inner side upper electrode 52 forms a shower head for injecting a predetermined gaseous mixture to the substrate W mounted on the susceptor 33. The inner side upper electrode 52 includes a circular electrode plate 70 having a plurality of gas injection holes 70a; and an electrode supporter 72 for supporting a top surface side of the electrode plate 70 to be freely attached thereto and detached therefrom. The electrode supporter 72 is formed in a circular plate shape of a same diameter as the electrode plate 70, and has therein a circular buffer chamber 73. In the buffer chamber 73, there is provided an annular partition wall member 74 formed of, e.g., an O-ring, as illustrated in FIG. 3, such that the buffer chamber 73 is divided into a first buffer chamber 73a of a central portion side and a second buffer chamber 73b of an outer peripheral portion side. The first buffer chamber 73a faces the central portion of the substrate W on the susceptor 33; and the second buffer chamber 73b faces the outer peripheral portion of the substrate W on the susceptor 33. The gas injection holes 70a communicate with bottom surfaces of the respective buffer chambers 73a and 73b, so that predetermined gaseous mixtures through the first and the second buffer chamber 73a and 73b can be injected toward the central portion and the outer peripheral portion of the substrate W, respectively. Further, a gas supply system for supplying a predetermined gaseous mixture to each buffer chamber 73 will be explained later.

As shown in FIG. 2, a lower power feed barrel 80 connected to the upper power feed rod 61 is electrically connected to the top surface of the electrode supporter 72. A variable capacitor 81 is provided in the lower power feed barrel 80. The variable capacitor 81 can adjust a relative ratio of an electric field intensity formed right below the outer side upper electrode 51 and that formed right below the inner side upper electrode 52, by using a high frequency voltage from the first high frequency power supply 64.

A gas exhaust port 90 is formed at the bottom portion of the processing vessel 30. The gas exhaust port 90 is connected to a gas pumping unit 92 having a vacuum pump and the like through a gas exhaust line 91. By the gas pumping unit 92, an inside of the processing vessel 30 can be depressurized to a desired vacuum level.

A second high frequency power supply 101 is electrically connected to the susceptor 33 through a matching unit 100. The second high frequency power supply 101 can output a high frequency voltage having a frequency in the range of, e.g., 2 MHz~20 MHz, and specifically, 20 MHz.

To the inner side upper electrode 52, there is electrically connected a low pass filter 102 for intercepting a high frequency wave from the first high frequency power supply 64, and supplying a high frequency wave from the second high frequency power supply 101 to make it penetrate through the ground. To the susceptor 33, there is electrically connected a high pass filter 103 for supplying a high frequency from the first high frequency power supply 64 to make it penetrate through the ground.

In the etching apparatus 4, there is provided a device controller 110 for controlling operations of various components such as the DC power supply 36, the first high frequency power supply 64, the second high frequency power supply 101 and the like for performing an etching process.

Figure 4:
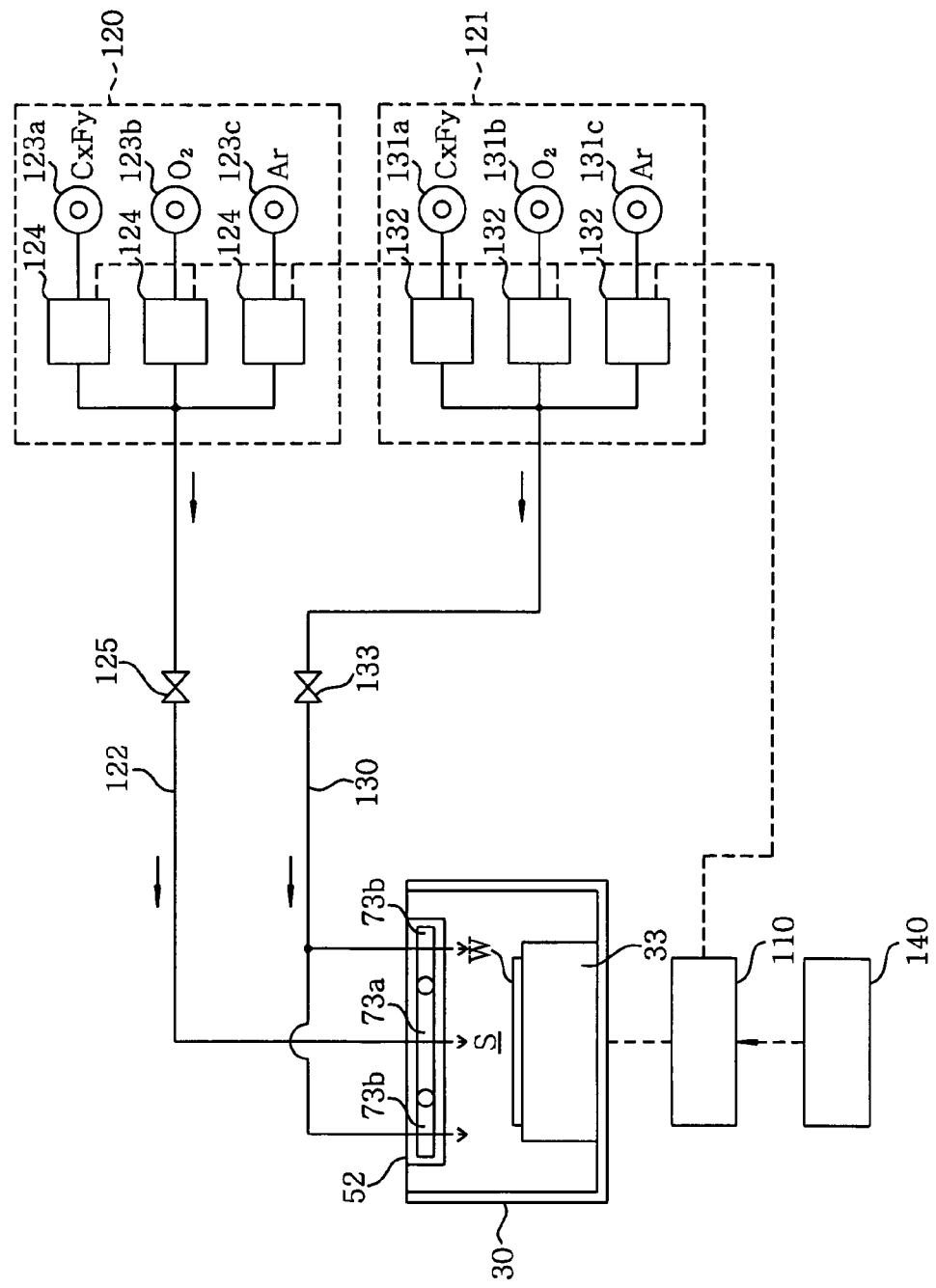
FIG. 4 presents a schematic view explaining a configuration of a gas supply system.

In the following, a gaseous mixture supply system with respect to the inner side upper electrode 52 will be explained. For example, as illustrated in FIG. 4, the inner side upper electrode 52 is connected to two gas boxes 120 and 121, which are set at an outer side of the processing vessel 30. For example, the first buffer chamber 73a in the central portion side of the inner side upper electrode 52 is connected to a first gas box 120 through a first gas supply line 122. The first gas box 120 has therein, e.g., three gas supply sources 123a, 123b and 123c. The first gas supply line 122 is extended toward the first gas box 120 from the first buffer chamber 73a, and branched off to communicate with the respective gas supply sources 123a~123c of the first gas box 120. In respective branch lines of the first gas supply line 122, mass flow controllers 124 are provided. By these mass flow controllers 124, gases from the respective gas supply sources 123a~123c are controlled to be mixed at a predetermined mixing ratio, and thus, being supplied to the first buffer chamber 73a. In the first gas supply line 122, there is provided a flow rate control valve 125 to supply a gaseous mixture of a predetermined flow rate to the first buffer chamber 73a.

In the present embodiment, a fluorocarbon based fluorine compound, e.g., $C_xF_y$ gas such as $CF_4$, $C_4F_6$, $C_4F_8$, $C_5F_8$ or the like, is stored, e.g., in the gas supply source 123a; and a control gas, e.g., $O_2$ gas, for controlling a deposition of, e.g., a CF based reaction product is stored in the gas supply source 123b. In the gas supply source 123c, there is stored a rare gas as a carrier gas, e.g., Ar gas.

In the same manner, the second buffer chamber 73b at the outer peripheral side of the inner side upper electrode 52 is connected to a second gas box 121 through a second gas supply line 130. The second gas box 121 has therein, e.g., three gas supply sources 131a, 131b and 131c. The second gas supply line 130, extended from the second buffer chamber 73b towards the second gas box 121, is branched off to communicate with the respective gas supply sources 131a~131c of the second gas box 121. Mass flow controllers 132 are provided in branch lines of the second gas supply line 130, respectively. By the mass flow controllers 132, gases from the respective gas supply sources 131a~131c can be controlled to be mixed at a predetermined mixing ratio, thereby, being supplied into the second buffer chamber 73b. A flow rate control valve 133 is provided in the second gas supply line 130 such that a gaseous mixture is supplied into the second buffer chamber 73b at a predetermined flow rate.

In the present embodiment, a main etching gas, e.g., $C_xF_y$ gas, is stored in the gas supply source 131a, and a removal gas, e.g., $O_2$ gas, for removing a deposition of, e.g., CF based reaction product is stored in the gas supply source 131b, same as the gas supply sources 123a~123c of the first gas box 120. In the gas supply source 131c, a dilution gas, e.g., Ar gas, is stored.

For example, the device controller 110 of the etching apparatus 4 controls operations of the mass flow controllers 124 and 132 and the flow rate control valves 125 and 133 of the first gas supply line 122 side and the second gas supply line 130 side, respectively. In the device controller 110, there are set mixing ratios and flow rates of gaseous mixtures supplied into the first buffer chamber 73a and the second buffer chamber 73b, respectively; and the device controller 110 can control operations of the respective mass flow controllers 124 and 132 or the flow rate control valves 125 and 133 based on various settings of the corresponding gaseous mixture.

In the etching apparatus 4, there is provided a gas setting apparatus 140 for executing setting processes of the respective gaseous mixtures, which are supplied into the first and the second buffer chamber 73a and 73b. The gas setting apparatus 140 is formed of, e.g., a general-purpose computer. The gas setting apparatus 140 can communicate with, e.g., the device controller 110, and execute various setting processes of the gaseous mixture of the device controller 110 by outputting setting information to the device controller 110. Further, as illustrated in FIG. 1, the gas setting apparatus 140 can communicate with the film thickness measurement device 25 and the surface shape measurement instrument 26 of the measuring unit 5, or a main controller (not shown) of the substrate processing system 1.

In the etching process using the etching apparatus 4 as configured above, the substrate W is first mounted on the susceptor 33. Subsequently, the processing space S is exhausted through a gas exhaust line 90 such that the pressure in the processing space S can be adjusted to be kept at a predetermined pressure. From the inner side upper electrode 52, a gaseous mixture as an etching gas, made of, e.g., $C_xF_y$ gas, $O_2$ gas and Ar gas, is supplied into the processing space S. At this time, a gaseous mixture from the first buffer chamber 73a (hereinafter, referred to as 'the first gaseous mixture') and that from the second buffer chamber 73b (hereinafter, referred to as 'the second gaseous mixture') are supplied towards the central portion of the substrate W and the outer peripheral thereof, respectively. High frequency power from the high frequency power supply 101 is applied to the susceptor 33 such that the gas in the processing space S turns into a plasma. By the operation of the plasma, a film on the substrate W is etched to be made of a predetermined shape.

Figure 5:
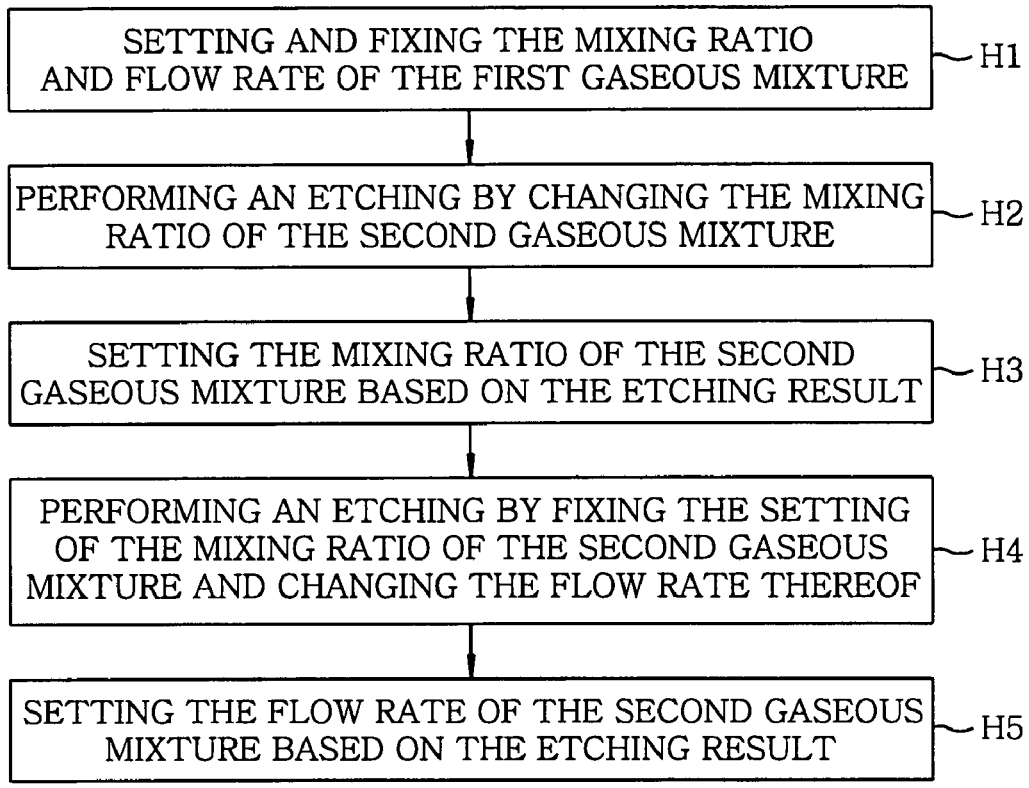
FIG. 5 is a flowchart of a gas setting process.

In the following, a setting process of the gaseous mixture in the etching apparatus 4 will be discussed. FIG. 5 is a flowchart of such a setting process.

First, a mixing ratio and a flow rate of the first gaseous mixture supplied to the first buffer chamber 73a are set (step H1 of FIG. 5). The setting of the first gaseous mixture is carried out under, e.g., a predetermined processing condition of the etching process. Hence, a gas supplied to the central portion of the substrate W is set. Thereafter, the setting of the first gaseous mixture is fixed to be unchanged. Subsequently, the etching process is performed several times by changing a mixing ratio of the second gaseous mixture supplied to the second buffer chamber 73b, while the first gaseous mixture is fixed (step H2 of FIG. 5). Changing the mixing ratio is conducted by way of changing a flow rate ratio of $C_xF_y$ gas, $O_2$ gas and Ar gas from the respective gas supply sources 131a~131c, by controlling a set flow rate of each mass flow controller 132 of the gas supply system. At this time, the mixing ratio may be changed by sequentially performing a process on all the gases under such condition where only a flow rate of a gas supplied from one gas supply source is changed, while flow rates of gases from other gas supply sources are fixed. In this case, an effect of each gas on the etching process can be readily secured. Further, the mixing ratio may be changed by properly setting the flow rate of each gas by using a design of experiment or the like. In such a case, it is possible to understand the effect of each gas by performing only a few processes.

Each of etched substrates W is transferred to the measuring unit 5 and an etching selectivity of, e.g., the etching mask with the film to be etched is measured by, e.g., the film thickness measurement device 25. Further, the etching shape is measured by the surface shape measurement instrument 26. Through the etching shape measurement, measured is a line width dimension (a top CD) of the upper end portion of a groove in a film to be etched, which is formed by the etching process.

After that, from a plurality of etching results, the mixing ratio, wherein etching selectivity and etching shape become most uniform in the central portion and the outer peripheral portion of the substrate W, is defined to be set as the mixing ratio of the second gaseous mixture (step H3 of FIG. 5).

Subsequently, the etching process is performed several times by changing the flow rate of the second gaseous mixture, while the mixing ratio of the second gaseous mixture is fixed (step H4 of FIG. 5). The flow rate is changed by controlling a set flow rate of the flow rate control valve 133 of the gas supply system. Each of the etched substrates W is transferred to the film thickness measurement device 25 of the measuring unit 5 and the etching rate is measured. From these etching results, the flow rate, at which etching rates become most uniform in the central portion and the outer peripheral portion of the substrate W, is defined to be set as the flow rate of the second gaseous mixture (step H5 of FIG. 5). In this way, settings of the mixing ratios and the flow rates of the first and the second gaseous mixture, which are supplied to the first buffer chamber 73a and the second buffer chamber 73b, respectively, are executed.

Figure 6:
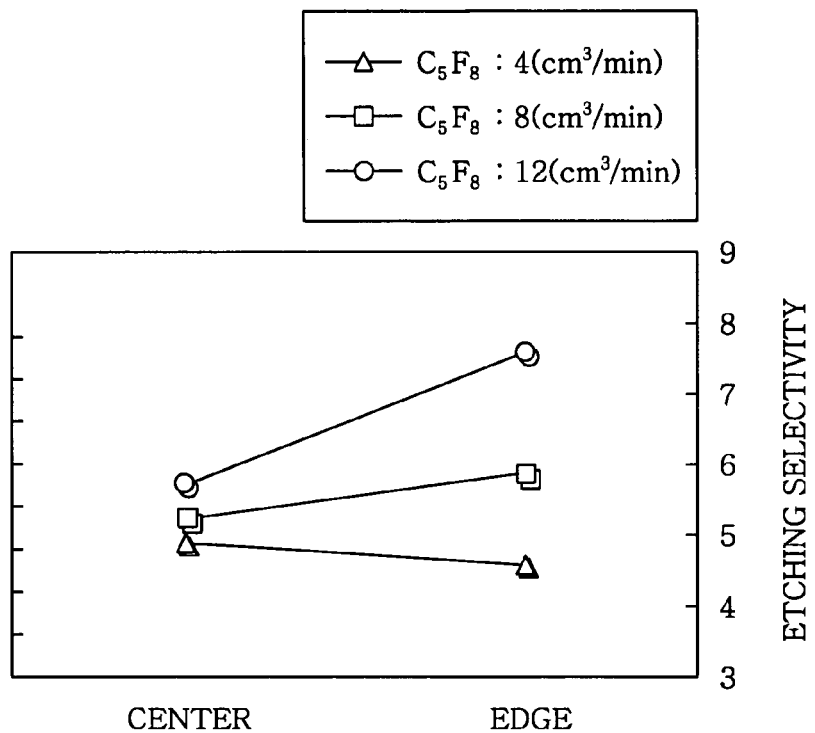
FIG. 6 describes a graph showing experimental data on etching selectivities in an outer peripheral portion and a central portion of a substrate W, as a function of a mixing ratio of a second gaseous mixture.
Figure 7:
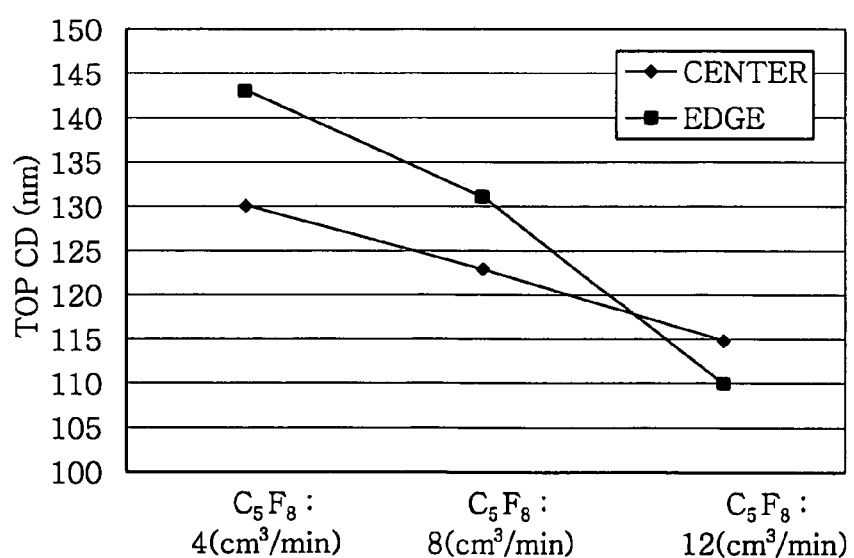
FIG. 7 illustrates a graph showing experimental data on top CDs in the outer peripheral portion and the central portion of the substrate W, as a function of the mixing ratio of the second gaseous mixture.

Hereinafter, the effect of the aforementioned setting process will be verified. FIG. 6 is a graph showing experimental data on etching selectivities at the outer peripheral portion and the central portion of the substrate W, in case where the mixing ratio of the second gaseous mixture supplied to the outer peripheral portion of the substrate W was changed. FIG. 7 is a graph showing experimental data on top CDs at the outer peripheral portion and the central portion of the substrate W, in case where the mixing ratio of the second gaseous mixture supplied to the outer peripheral portion of the substrate W was changed. Experiments represented in FIGS. 6 and 7 are carried out under the conditions as follows:

Gaseous mixture: $C_5F_8/Ar/O_2$;
Processing pressure: 1.99 Pa (15 mT);
High frequency power: 1800 W;
Flow rate of the first gaseous mixture: $C_5F_8/Ar/O_2$=8/190/10 cm$^3$/min;
Flow rate of the second gaseous mixture: $C_5F_8/Ar/O_2$=4, 8, 12/190/10 cm$^3$/min; and
Temperature of the substrate: 50° C.

Figure 8:
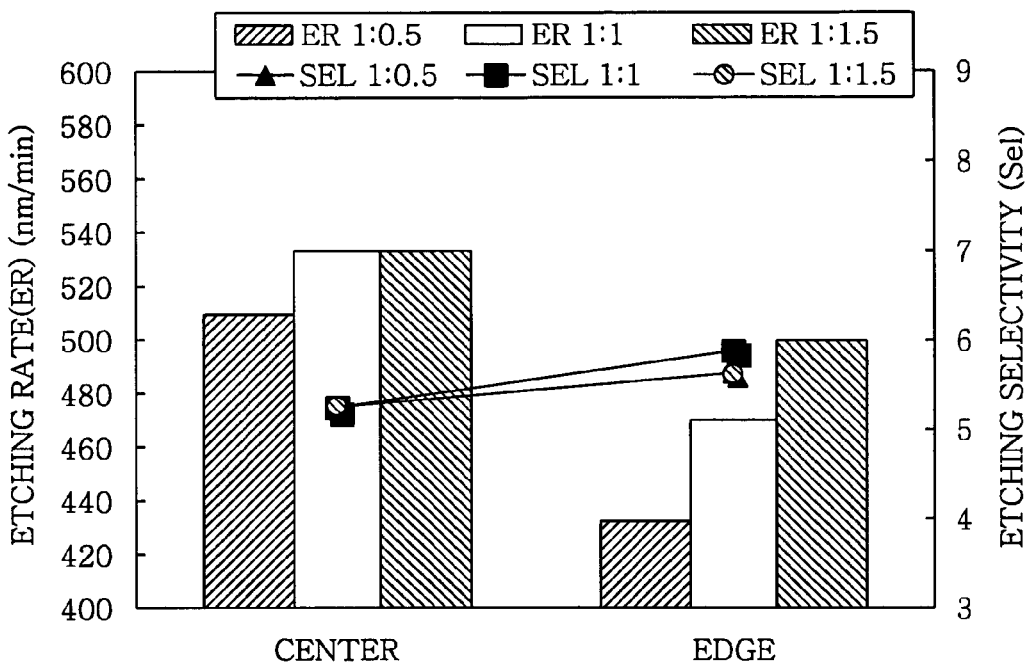
FIG. 8 is a graph showing experimental data on etching selectivities in the outer peripheral portion and the central portion of the substrate W, as a function of a flow rate of the second gaseous mixture.

FIG. 8 is a graph showing experimental data on etching selectivities at the outer peripheral portion and the central portion of the substrate W, in case where the flow rate of the second gaseous mixture supplied to the outer peripheral portion of the substrate W was changed. The experiment represented in FIG. 8 was performed under the aforementioned conditions, while a flow rate ratio of the second gaseous mixture to the first gaseous mixture was changed to 1:0.5, 1:1, and 1:1.5, respectively.

As can be seen from FIG. 6, if the mixing ratio of the second gaseous mixture is changed, the etching selectivity at the outer peripheral portion of the substrate W is significantly changed compared to the central portion thereof. From FIG. 7, it can be noted that, if the mixing ratio of the second gaseous mixture is changed, the top CD at the outer peripheral portion of the substrate W is significantly changed compared to that at the central portion thereof. As is clear from FIG. 8, the etching rate at the outer peripheral portion is changed significantly more than that at the central portion thereof. From such results, it can be noted that the etching characteristics at the outer peripheral portion of the substrate W can be adjusted efficiently by changing the mixing ratio or the flow rate of the second gaseous mixture supplied to the outer peripheral portion of the substrate W. Further, it can be secured that the etching selectivity and the top CD at the outer peripheral portion of the substrate W can be adjusted relative to the central portion thereof by changing the mixing ratio of the second gaseous mixture. Therefore, the etching selectivity and the top CD of in-substrate may be made uniform by adjusting the mixing ratio of the second gaseous mixture.

Figure 9:
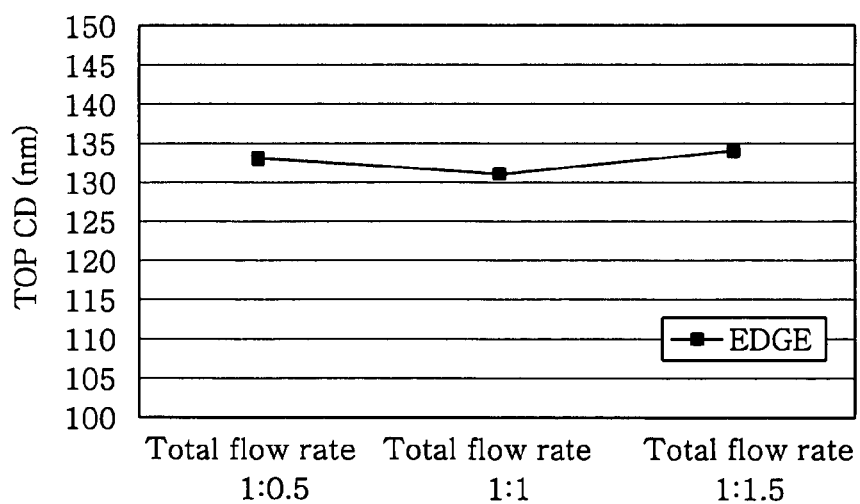
FIG. 9 offers a graph showing experimental data on top CDs in the outer peripheral portion and the central portion of the substrate W, as a function of the flow rate of the second gaseous mixture.

FIG. 8 also shows experimental data on etching selectivities at the outer peripheral portion and the central portion of the substrate W, in case where the flow rate of the second gaseous mixture supplied to the outer peripheral portion of the substrate W was changed. FIG. 9 is a graph showing experimental data on top CDs at the outer peripheral portion and the central portion of the substrate W, in case where the flow rate of the second gaseous mixture supplied to the outer peripheral portion of the substrate W was changed. From FIGS. 8 and 9, it can be known that the etching selectivity and the top CD at the outer peripheral portion of the substrate W are hardly changed, even though the flow rate of the second gaseous mixture supplied to the outer peripheral portion of the substrate W is changed. As a result, it is possible to adjust only the etching rate at the outer peripheral portion of the substrate W by changing the flow rate of the second gaseous mixture. Therefore, it is possible to make the etching rates at the outer peripheral portion and the central portion of the substrate W uniform by adjusting the flow rate of the second gaseous mixture.

In accordance with the setting process described in the aforementioned embodiment, the mixing ratio or the flow rate of the second gaseous mixture supplied to the outer peripheral portion of the substrate W is adjusted while the mixing ratio and the flow rate of the first gaseous mixture supplied to the central portion of the substrate W are being fixed, so that the etching characteristics at the outer peripheral portion of the substrate W can be efficiently adjusted. Accordingly, it is possible to properly adjust the in-substrate uniformity in etching characteristics in a short time. Further, since the mixing ratio of the second gaseous mixture, which greatly affecting the etching selectivity and the etching shape, is adjusted first, and then the flow rate thereof, affecting only the etching rate, is adjusted next, the in-substrate etching characteristic can be more efficiently adjusted to be uniform.

Figure 10:
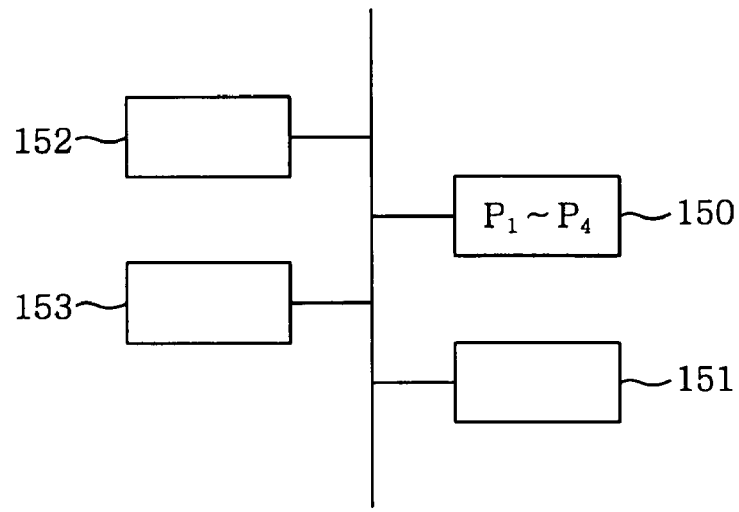
FIG. 10 is a block diagram showing a configuration of a gas setting apparatus.

The setting process of the gaseous mixture, as described in the aforementioned embodiment, may be carried out in an automated manner by, e.g., the gas setting apparatus 140. In such a case, as described in FIG. 10, the gas setting apparatus 140 includes a program storage unit 150, such as a memory or the like, for storing a predetermined program; a data storage unit 151, such as a memory or the like, for storing predetermined data; an operation unit 152 such as a CPU or the like for executing each program; and a communications unit 153.

In the program storage unit 150, there are stored a program P1 for measuring an etching selectivity and an etching shape of each substrate W at the measuring unit 5, in case when the etching process is carried out in the etching apparatus 4 on a plurality of substrates W by changing a mixing ratio of the second gaseous mixture while a mixing ratio and a flow rate of the first gaseous mixture are fixed; a program P2 for defining the mixing ratio of the second gaseous mixture to make uniform etching selectivities and etching shapes at the outer peripheral portion and the central portion of the substrate W, based on the measurement result by the program P1; a program P3 for measuring an etching rate of each substrate W at the measuring unit 5, in case when the etching process is carried out on a plurality of substrates W by changing a flow rate of the second gaseous mixture while the mixing ratio of the second gaseous mixture is fixed; and a program P4 for defining the flow rate of the second gaseous mixture to make etching rates at the outer peripheral portion and the central portion of the substrate W uniform.

The data storage unit 151 can store measurement data from the measuring unit 5. The communications unit 153 can communicate with the measuring unit 5 or the device controller 110.

Further, in case when a gaseous mixture is set, the program P1 is executed first such that the etching process is carried out in the etching apparatus 4 on a plurality of substrates W by changing the mixing ratio of the second gaseous mixture for each time, while the mixing ratio and the flow rate of the first gaseous mixture are fixed; and the etching selectivity and the etching shape of each substrate W are measured in the measuring unit 5. These measurement results from the measuring unit 5 are inputted to the gas setting apparatus 140 by the communications unit 153 to thereby be stored, e.g., in the data storage unit 151. Subsequently, the program P2 is executed to define and set the mixing ratio at which the etching selectivities and the etching shapes become most uniform at the outer peripheral portion and the central portion of the substrate W, based on the measurement results.

Thereafter, by the program P3, the etching process is performed on a plurality of substrates W by changing the flow rate of the second gaseous mixture for each time while the mixing ratio of the second gaseous mixture is fixed; and the etching rate of each substrate W is measured at the measuring unit 5. These measurement results are stored, e.g., in the data storage unit 151. The program P4 is executed to define and set the flow rate, at which the etching rates become most uniform at the outer peripheral portion and the central portion of the substrate W, based on these measurement results. In accordance with the present embodiment, it is possible to perform the setting process of the gaseous mixture in a short time. Further, since the setting process is executed in an automated manner by the program, the quality in gas setting can be kept uniform without depending on skillfulness such as an operation by a person.

Figure 11:
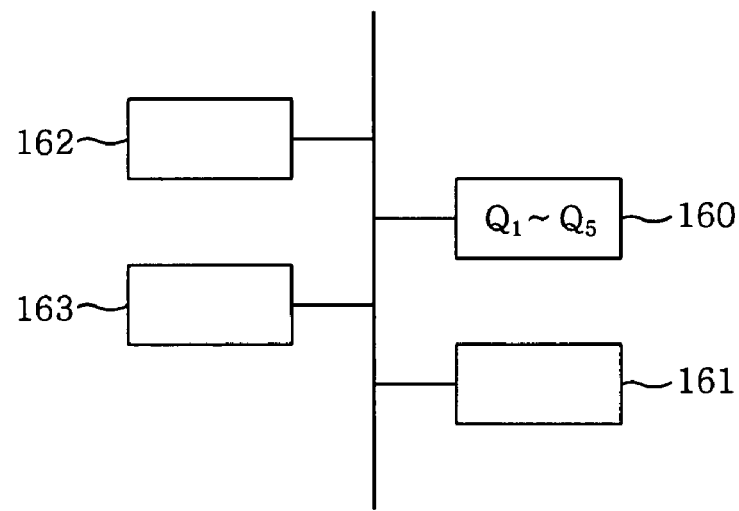
FIG. 11 sets forth a block diagram showing another configuration of the gas setting apparatus.

In the gas setting apparatus 140 in accordance with the aforementioned embodiment, it can be configured such that a correlation between the first gaseous mixture setting, the second gaseous mixture setting and etching results thereof is drawn up in advance, and an optimal setting value is prepared based on the correlation when the gas setting is executed. In such a case, the gas setting apparatus 140 includes a program storage unit 160, a data storage unit 161, an operation unit 162 and a communications unit 163, as illustrated in FIG. 11.

For example, in the program storage unit 160, there are stored a program Q1 for creating a relational equation as a correlation between the first and the second gaseous mixture setting and etching results thereof, based on a plurality of etching process results, which have been performed by changing the flow rate or the mixing ratio of the second gaseous mixture in the state where the mixing ratio and the flow rate of the first gaseous mixture are fixed; a program Q2 for measuring the etching selectivity, the etching shape and the etching rate of the substrate W, when performing the etching process is performed on the substrate W at established settings of the first and the second gaseous mixture in the etching apparatus 4; a program Q3 for determining whether or not etching characteristics are uniform at the outer peripheral portion and the central portion of the substrate W based on the measurement results by the program Q2; a program Q4 for calculating the mixing ratio of the second gaseous mixture, at which etching selectivities and etching shapes at the central portion and the outer peripheral portion of the substrate W become uniform, and then, calculating the flow rate of the second gaseous mixture, at which the etching rates at the central portion and the outer peripheral portion of the substrate W become uniform based on the measurement result by the program Q2 and the correlation equation by the program Q1, in case where the etching characteristics are not uniform; and a program Q5 for changing the setting of the second gaseous mixture into the mixing ratio and the flow rate thereof calculated by the program Q4.

In such a case, for example, if the program Q1 is executed, a correlation data D between the first and the second gaseous mixture and the etching results thereof is obtained as described in FIG. 12, based on a plurality of etching results, which were performed by changing the flow rate or the mixing ratio of the second gaseous mixture while the mixing ratio and the flow rate of the first gaseous mixture were fixed; and a relational equation M between the settings of the first and the second gaseous mixture and the etching characteristics is created based on the corresponding correlation data. The etching result as a data source of the correlation data D is obtained by an experiment or the like, which had been conducted in advance, and stored in, e.g., the data storage unit 161. The relational equation M is created by, e.g., a multivariate analysis, as a relational equation between a variation of the mixing ratio and that of the etching rate of the second gaseous mixture, or a relational equation between a variation of the flow rate and variations of the etching selectivity and the etching shape of the second gaseous mixture. The relational equation M is stored, e.g., in the storage unit 161 after being created.

Further, in case where the etching status of the etching apparatus 4 may possibly be changed, e.g., if maintenance for the etching apparatus 4 is carried out, the program Q2 is executed such that a single substrate W is subject to the etching process at the established gas setting in the etching apparatus 4, and the etching selectivity, the etching shape and the etching rate of the substrate W are measured at the measuring unit 5. Subsequently, the program Q3 is executed, so that it is determined whether or not etching characteristics at the outer peripheral portion and the central portion of the substrate W are uniform, based on, e.g., the measurement results. Such determination is conducted, e.g., for each etching characteristic by the comparison of a difference in measured etching characteristics at the outer peripheral portion with those at the central portion of the substrate, with a predetermined critical value of the difference.

If the etching characteristics are determined to be non-uniform, the program Q4 is executed such that the mixing ratio of the second gaseous mixture, at which the etching selectivities and the etching shapes at the central portion and the outer peripheral portion of the substrate W become uniform, is calculated based on the measurement result and the relational equation M by the program Q2, and then, the flow rate of the second gaseous mixture, at which the etching rates at the central portion and the outer peripheral portion of the substrate W become uniform, is calculated.

After that, the program Q5 is executed, so that the setting of the second gaseous mixture is changed into the calculated mixing ratio and flow rate of the second gaseous mixture in the device controller 110.

In accordance with the present embodiment, the setting process of the gaseous mixture can be carried out easily in a short time, even though the etching process status is slightly changed due to maintenance or the like.

Figure 13:
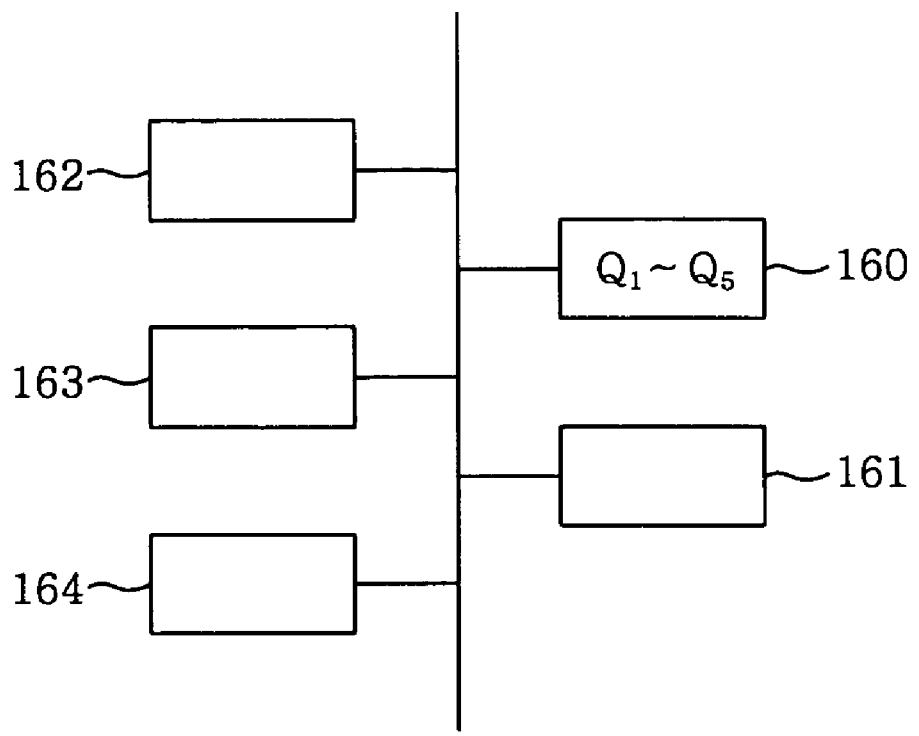
FIG. 13 is a block diagram showing still another configuration of the gas setting apparatus.

In the aforementioned embodiment, as illustrated in FIG. 13, the gas setting apparatus 140 may include a display unit 164 to display therein the calculation results of the mixing ratio and the flow rate of the second gaseous mixture, which have been obtained based on the correlation data D and the relational equation M. In this case, it is possible to understand whether or not the operator conducts the changing of the setting.

In the aforementioned embodiment, the mixing ratio of the second gaseous mixture is set such that both of the etching selectivity and the etching shape become uniform in the substrate. However, if necessary, the mixing ratio of the second gaseous mixture may be set such that one of the etching selectivity and the etching shape becomes uniform in the substrate W.

Heretofore, while the preferred embodiment of the present invention has been described, the present invention is not limited thereto, and various changes and modifications may be made. For example, in the aforementioned embodiment, the gas setting device 140 may be an external computer, which can be connected to the device controller 110, or a built-in computer of the etching apparatus 4 or the substrate processing system 1. Further, the etching apparatus 4 described in the aforementioned embodiment has a parallel plate type electrode structure. However, the present invention is applicable for other etching apparatus such as a microwave etching apparatus, an ECR etching apparatus or the like. Further, the configuration of the substrate processing system 1 having thereon the etching apparatus 4 is not limited to the aforementioned embodiment. Still further, the present invention may be applied to an etching apparatus of the substrate such as a semiconductor wafer, an FPD (flat panel display), a mask reticle for photomask, or the like.

INDUSTRIAL APPLICABILITY

The present invention can be applied to simply and properly perform a setting of a gaseous mixture, which is supplied to an etching apparatus, in a short time.

Specifically, in accordance with the present invention, it is possible to perform a setting of each gaseous mixture, which is supplied to a central portion or an outer peripheral portion of a substrate in a processing chamber, in a short time, so that a processing efficiency in an etching process and an in-substrate uniformity in an etching characteristic may be improved.

While the invention has been shown and described with respect to the preferred embodiments, it will be understood by those skilled in the art that various changes and modifications may be made without departing from the scope of the invention as defined in the following claims.

What is claimed is:

1. A gas setting method for setting mixing ratios and flow rates of gaseous mixtures supplied into a processing chamber in which substrates are etched, the method comprising:

performing etchings on a part of the substrates while fixing a mixing ratio and a flow rate of a first gaseous mixture and changing a mixing ratio of a second gaseous mixture, and thereafter, setting the mixing ratio of the second gaseous mixture based on etching results thereof such that at least one of an etching selectivity and an etching shape is made uniform throughout central portions and outer peripheral portions of the part of the substrates, wherein while performing the etchings on the part of the substrates, the first and the second gaseous mixture are supplied to the central portions and the outer peripheral portions of the part of the substrates, respectively; and then performing etchings on a remaining part of the substrates while fixing the mixing ratio and the flow rate of the first gaseous mixture and the mixture ratio of the second gaseous mixture and changing a flow rate of the second gaseous mixture, and thereafter, setting the flow rate of the second gaseous mixture based on etching results thereof such that etching rates in the central portions and the outer peripheral portions of the remaining part of the substrates are made uniform, wherein while performing the etchings on the remaining part of the substrates, the first and the second gaseous mixture are supplied to the central portions and the outer peripheral portions of the remaining part of the substrates, respectively.

2. A gas setting method for setting mixing ratios and flow rates of gaseous mixtures supplied to a processing chamber, the method comprising:

setting a mixing ratio and a flow rate of a first gaseous mixture supplied to central portions of first test substrates;

drawing up a correlation between settings of the first and a second gaseous mixture and etching results thereof based on the etching results obtained by way of performing etchings on the first test substrates while fixing the mixing ratio and the flow rate of the first gaseous mixture and changing at least one of a flow rate and a mixing ratio of the second gaseous mixture supplied to outer peripheral portions of the first test substrates;

performing an etching on a second test substrate at an established gas setting;

calculating the mixing ratio of the second gaseous mixture based on an etching result obtained by performing the etching at the established gas setting and the drawn-up correlation so that at least one of an etching selectivity and an etching shape is made uniform throughout a central portion and an outer peripheral portion of the second test substrate; and then calculating the flow rate of the second gaseous mixture based on the etching result obtained by performing the etching at the established gas setting and the drawn-up correlation so that etching rates at the central portion and the outer peripheral portion of the second test substrate are made uniform.

3. The gas setting method of claim 2, wherein, if the etching result on the established gas setting falls outside a tolerance range, the mixing ratio and the flow rate of the second gaseous mixture are calculated.

4. The gas setting method of claim 2 further comprising:
setting the calculated mixing ratio and the calculated flow rate as the mixing ratio and the flow rate of the second gaseous mixture.

5. The gas setting method of claim 2, wherein the etching results include etching selectivities, etching shapes and etching rates obtained from each of the central and the outer peripheral portion.

* * * * *